(12) United States Patent
Schreiber et al.

(10) Patent No.: US 6,402,526 B1
(45) Date of Patent: Jun. 11, 2002

(54) MICROELECTRONIC CONTACT ASSEMBLY

(75) Inventors: Chris M. Schreiber, Lake Elsinore; John Steven Szalay, Corona Del Mar, both of CA (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/705,969

(22) Filed: Nov. 3, 2000

(51) Int. Cl.$^7$ .............................................. H01R 12/00
(52) U.S. Cl. ............................ 439/67; 439/66; 439/493
(58) Field of Search ........................... 439/66, 67, 637, 439/80, 91, 493

(56) References Cited

U.S. PATENT DOCUMENTS

| | | | |
|---|---|---|---|
| 3,629,787 A | 12/1971 | Wilson | 439/67 |
| 4,116,517 A | 9/1978 | Selvin et al. | 439/67 |
| 4,125,310 A | 11/1978 | Reardon, II et al. | 439/329 |
| 4,466,184 A | 8/1984 | Cuneo et al. | 29/830 |
| 4,602,317 A | 7/1986 | Rovnyak et al. | 361/785 |
| 4,611,869 A | 9/1986 | Bonnefoy | 439/373 |
| 4,850,883 A | 7/1989 | Kabadi | 439/67 |
| 4,895,523 A | 1/1990 | Morrison et al. | 439/67 |
| 4,948,374 A | 8/1990 | Carter | 439/67 |
| 5,211,577 A | 5/1993 | Daugherty | 439/493 |
| 5,245,750 A | 9/1993 | Crumly et al. | 29/840 |
| 5,515,086 A | 5/1996 | Kakizaki et al. | 347/750 |
| 5,558,523 A | 9/1996 | Coteus et al. | 439/67 |
| 5,707,241 A | 1/1998 | Hamlin et al. | 439/67 |
| 5,730,619 A | 3/1998 | Hamlin | 439/493 |
| 5,790,377 A | 8/1998 | Schreiber et al. | 361/704 |
| 5,873,740 A | * 2/1999 | Alcoe et al. | 439/67 |
| 5,947,750 A | 9/1999 | Alcoe et al. | 439/67 |

* cited by examiner

*Primary Examiner*—Tulsidas Patel
(74) *Attorney, Agent, or Firm*—Thomas N. Twomey

(57) ABSTRACT

An electronic interconnect includes a flexible circuit which has a plurality of contacts formed thereon. A plurality of springs is positioned so as to apply a compressive force to at least one of the contacts when the electronic interconnect is mated. A resilient material is configured to apply a compressive force to at least one of the springs.

20 Claims, 3 Drawing Sheets

MICROELECTRONIC CONTACT ASSEMBLY

FIELD OF THE INVENTION

The present invention relates generally to electrical interconnects. The present invention relates more particularly to a microelectronic contact assembly having a plurality of metallic springs and an elastomeric pad which cooperate to effect reliable electrical contact between raised interconnection features, such as bump contacts, formed upon a flexible circuit and contact pads of an electronic device.

BACKGROUND OF THE INVENTION

It is frequently desirable to attach electronic devices, such as integrated circuits or printed circuit boards, to flexible circuits. Flexible circuits typically have bump contacts or the like formed thereon to facilitate such attachment. The bump contacts of the flexible circuit provide electrical contact to corresponding contact pads of the electronic device so as to facilitate electrical communication between the flexible circuit and the electronic device.

According to contemporary practice, compressive force is applied to the flexible circuit so as to urge the bump contacts thereof into intimate contact with the corresponding contact pads of the electronic device. This compressive force is typically applied via a clamp and/or fastener arrangement which defines an attachment device or connector for maintaining the desired mechanical contact of the bump contacts of the flexible circuit with the contact pads of an electronic device. Occasionally, an elastomeric pad is provided on the opposite side of the flexible circuit, with respect to the bump contacts, in an attempt to maintain adequate compressive force over time. Thus, the elastomeric pad is compressed substantially by the clamping device and/or the fasteners which hold the flexible circuit in position with respect to the electronic device.

In this manner, the elastomeric pad is captured within the attachment device and is compressed as the bump contacts of the flexible circuit are urged into intimate contact with the corresponding contact pads of the electronic device. The compressed elastomeric pad generally continues to apply a compressive force to the bump contacts of the flexible circuit in an attempt to maintain the intimate contact of the bump contacts with the contact pads for a prolonged period of time.

As those skilled in the art will appreciate, such elastomeric pads additionally provide compliance by allowing the bump contacts of the flexible circuit to move with respect to the plane within which they are nominally formed. That is, the bump contacts are permitted to move generally at right angles with respect to this plane, so as to compensate for non-coplanar alignment of the corresponding contact pads of the electronic device. In this manner, the elastomeric pad tends to assure reliable contact of the bump contacts of the flexible circuit with the contact pads of the electronic device, even though there may be imperfections in the planar alignment of the contact pads of the electronic device.

Further, such elastomeric pads tend to concentrate the compressive force generally at the locations of the bump contacts, where the compressive force is needed. Since the compressive force tends to be concentrated in such a manner, the total clamping force may be reduced, thus facilitating construction of the attachment device of lighter and less expensive materials. Thus, the use of a resilient pad assures that the compressive force is selectively concentrated upon the contact feature, instead of being distributed across the entire terminus array.

However, as those skilled in the art will appreciate, such elastomeric pads tend to take on a mechanical compression set when compressed for a prolonged period of time, whereby such elastomeric pads tend to lose at least a portion of their resiliency. Thus, the compressive force applied by such elastomeric pads tends to degrade or lessen over time. This effect is particularly pronounced when elastomeric pads are subjected to harsh environments, such as elevated temperatures.

Frequently, modern high-density interconnects are used to communicate signals at comparatively high frequencies. The operation of interconnects at such high frequencies may result in heat build up, which is detrimental to the lasting effectiveness of elastomeric pads. Additionally, such interconnects are frequently used in automotive and other electronic applications, wherein the temperature of the environment is inherently elevated. For example, such interconnects may find applications in facilitating electrical communication between engine transducers and the dashboard of an automobile. In such applications, it is generally desirable that the electronic devices for which communication is facilitated by the interconnect operate reliably.

In view of the foregoing, it is desirable to provide an electronic interconnect having a compliant structure for facilitating reliable electrical contact of the bump contacts of a flexible circuit with the contact pads of an electronic device, wherein the electronic interconnect is not substantially susceptible to mechanical compression set.

SUMMARY OF THE INVENTION

The present invention specifically addresses and alleviates the above-mentioned deficiencies associated with the prior art. More particularly, the present invention comprises an electronic interconnect which includes a flexible circuit having a plurality of contacts formed thereon, a plurality of springs positioned so as to apply a compressive force to at least one of the contacts when the electronic interconnect is mated, and a resilient material configured to apply a compressive force to at least one of the springs.

According to the preferred embodiment of the present invention, the contacts formed upon the flexible circuit comprise bump contacts. The bump contacts are preferably formed upon the flexible circuit so as to define an array of bump contacts. The array of bump contacts may be of any desired shape. For example, the array of bump contacts may be generally circular, triangular, square, rectangular, hexagonal, octagonal, etc.

The springs preferably comprise metallic springs. The metallic springs are preferably formed so as to define an array thereof. The array of metallic springs will generally conform in shape to the array of bump contacts. Thus, for example, if the array of bump contacts is square, then the array of springs will typically be square as well. Generally, each pad possessing bump contacts (some pads have more than one bump formed thereon) has a dedicated metallic spring, so that there is a one-to-one correspondence between pads and metallic springs.

It is important to understand that each pad may optionally comprise more than one bump contact. For example, a single pad may have two, three, four or more separate bump contacts formed thereon. The use of a plurality of bump contacts for a single pad is generally done so as to enhance the reliability of the connection formed thereby. As those skilled in the art will appreciate, the use of such a plurality of bump contacts substantially enhances the reliability of electrical contact by providing a plurality of surfaces through which contact is made.

Thus, according to the preferred embodiment of the present invention, the contacts comprise an array of bump contacts and the springs comprise a corresponding array of springs, wherein each spring is configured so as to apply a compressive force to a dedicated pad possessing bump contacts when the interconnect is mated. The springs are disposed on an opposite side of the flexible circuit with respect to the contacts.

The resilient material preferably comprises a sheet of elastomer, e.g., an elastomeric pad, which is configured so as to apply compressive force to the springs when the interconnect is mated. The elastomeric pad applies a compressive force which is substantially localized to each individual bump contact. However, the use of an elastomeric pad alone would be subject to the problems associated with the elastomeric pad eventually taking a mechanical compression set, thereby losing at least some portion of the compressive force applied thereby. According to the present invention, the array of metallic springs continues to provide a compressive force to the bump contacts, even in the event of the elastomeric pad undergoes a mechanical compression set.

Preferably, the elastomeric pad is configured to facilitate substantially independent movement of the metallic springs with respect to one another, so as to provide the desired compliance. That is, the combination of the elastomeric pad and the array of metallic springs is flexible or bendable, such that the elastomeric pad and the metallic springs can move so as to accommodate imperfections in the planarity of the contact pads of the electronic device.

Thus, according to the present invention, each spring is configured so as to apply compressive force to only a dedicated pad possessing bump contacts when the electronic interconnect is mated. The elastomeric pad is preferably configured so as to facilitate substantially independent movement of the metallic springs with respect to one another, wherein such independent movement is generally orthogonal to the plane of the springs. Such orthogonal movement of the springs thus provides compliance which facilitates a reliable interconnection of a plurality of closely spaced bump contacts of a flexible circuit with corresponding contact pads of an electronic device, particularly when the contact pads of the electronic device are not substantially coplanar with respect to one another.

The combination of the elastomeric pad and the metallic springs tends to concentrate compressive force generally at the locations of the bump contacts, such that less overall compressive force is required to effect reliable contact between the bump contacts of the flexible circuit and the contact pads of the electronic device. Because less overall compressive force is required, the clamping structure of the connecting device (which effects mechanical attachment of the flexible circuit to the electronic device) can be made of less expensive materials. As those skilled in the art will appreciate, contemporary clamping structures are generally constructed of metal, such that they are capable of applying the necessary, comparatively high, compressive force required to effect reliable connection of the bump contacts of flexible circuits to the contact pads of an electronic device.

These, as well as other, advantages of the present invention will be more apparent from the following description and drawings. It is understood that changes in the specific structure shown and described may be made within the scope of the claims without departing from the spirit of the invention.

DETAILED DESCRIPTION OF THE INVENTION

The detailed description set forth below in connection with the appended drawings is intended as an description of the presently preferred embodiment of the invention and is not intended to represent the only form in which the present invention may be constructed or utilized. The description sets forth the functions of the invention and the sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

Figure 1:
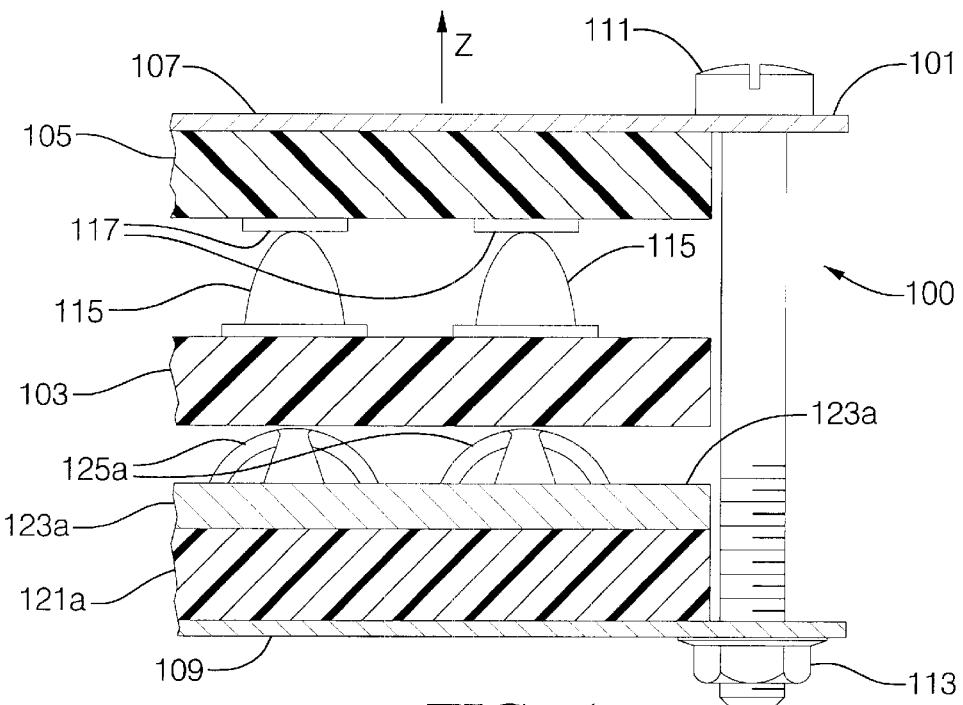
FIG. 1 is a semi-schematic fragmentary side view of an electronic interconnect, including a clamping structure, having metallic springs and having a resilient material disposed upon one side of the springs according to one configuration of the present invention.
Figure 2A:
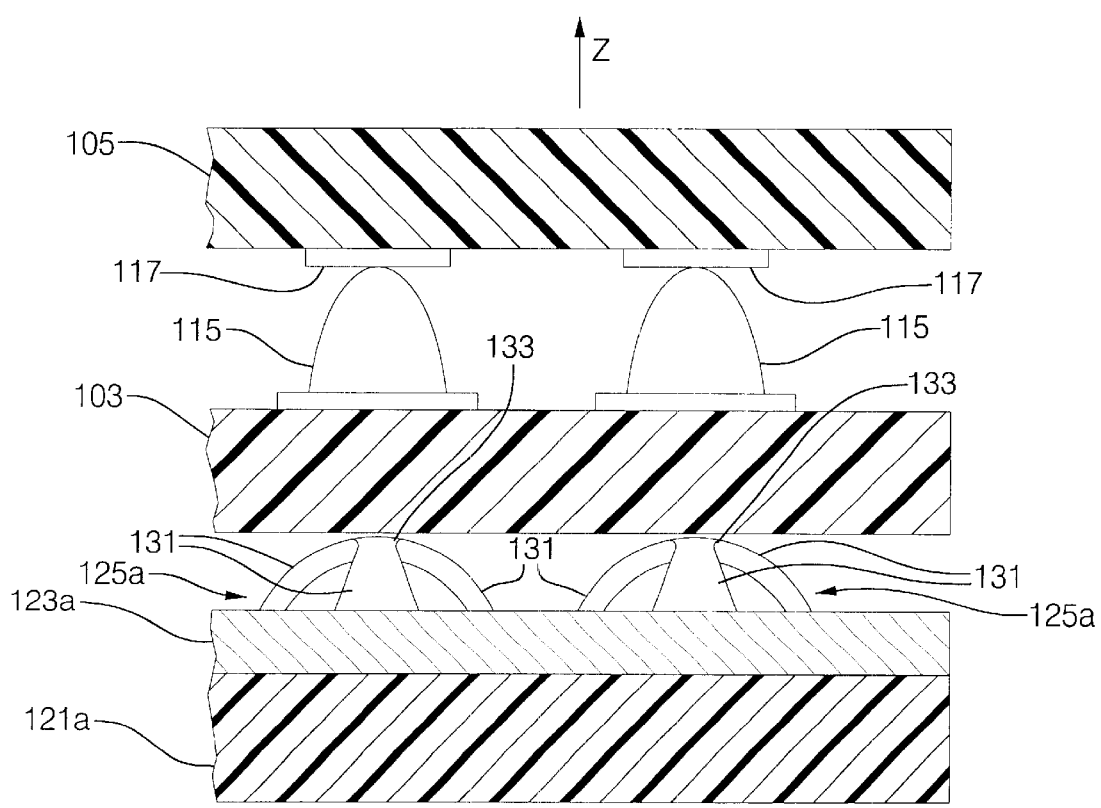
FIG. 2A is an enlarged semi-schematic fragmentary side view of the electronic interconnect of FIG. 1, having the clamping structure removed therefrom.

Referring now to FIGS. 1 and 2A, an electronic interconnect 100 comprises a clamping device 101 and a flexible circuit 103 to which it is desired that an electronic device 105 be placed in electrical communication. This is, the primary purpose of the electronic interconnect of the present invention is facilitating electrical communication between the flexible circuit 103 and the electronic device 105. The clamping device 101 maintains desired positioning and alignment of the flexible circuit 103 and the electronic device 105 and also applies a compressive force to the flexible circuit 103 and electronic device 105, as well as other components of the electronic interconnect 100, as discussed in detail below.

The clamping device 101 more particularly comprises a first clamp member 107, a second clamp member 109, and a plurality (generally two) of bolts 111 and their corresponding nuts 113 (each of which only a representative one is shown). FIG. 1 is a fragmentary view, showing only a representative portion of the electronic interconnect of the present invention. Typically, two bolts 111 and their corresponding nuts 113 will be utilized to effect clamping of the first clamp member 107 and second clamp member 109. Typically, the two bolts 111 and their corresponding nuts 113 are disposed at opposite ends of the clamping device 101. However, those skilled in the art will appreciate that the number of fastening devices, such as bolts 111 and corresponding nuts 113, as well as the position of fasteners, may be varied as desired.

The flexible circuit 103 has a plurality of raised features, such as bump contacts 115, formed upon one surface (the upper surface as shown in FIGS. 1 and 2A) thereof for facilitating electrical contact with the electronic device 105. Examples of methods for the construction of such bump contacts 115 are disclosed in U.S. Pat. No. 5,245,750, issued on Sep. 21, 1993 to Crumly et al. and entitled METHOD OF CONNECTING A SPACED IC CHIP TO A CONDUCTOR AND THE ARTICLE THEREBY OBTAINED, and in U.S. Pat. No. 5,790,377, issued on Aug. 4, 1998 to Schreiber et al. and entitled INTEGRAL COPPER COLUMN WITH SOLDER BUMP FLIP CHIP, the contents of both of which are hereby incorporated by reference. It is important to note that the two bump contacts 115 shown in FIGS. 1 and 2A are only representative examples of a larger number of such bump contacts which define an array thereof. Only two representative bump contacts 115 are shown since FIG. 1 is a fragmentary view. Such bump contacts 115 are preferably formed of gold, silver, platinum, lead, or solder. Generally, the bump contacts 115 will comprise a metal which is at least somewhat resistant to surface oxidation. A plurality of conductive conduits or traces formed upon the flexible circuit may terminate at such bump contacts 115 to facilitate the desired interconnection. Similarly, vias may be formed in the flexible circuit 103, so as to facilitate electrical interconnection of the bump contacts 115 and conductive conduits formed upon the opposite side (the bottom side as shown in FIGS. 1 and 2A) of the flexible circuit 103.

The electronic device 105 has a plurality of contact pads 117 formed upon one surface (the lower surface as shown in FIGS. 1 and 2A) thereof. The bump contacts 115 formed upon the flexible circuit 103 and the contact pads 117 formed upon the electronic device 105 are both preferably formed in an array, such as a rectangular array. The array may be of any desired shape, such as circular, triangular, square, rectangular, hexagonal, octagonal, etc.

An optional elastomeric pad 121a is disposed within the clamping device 101. The elastomeric pad 121a is positioned within the clamping device 101 such that the elastomeric pad 121a applies a compressive force which urges the flexible circuit 103 toward the electronic device 105, so as to assure continued reliable electrical contact of the bump contacts 115 with the contact pads 117. However, as discussed above, the use of an elastomeric pad 121a alone is not adequate to assure such reliable contact of the bump contacts 115 with the contact pads 117 over an extended period of time due to the undesirable effects of mechanical compression set.

According to the present invention, an array of springs, preferably metallic springs 125a, is disposed intermediate the elastomeric pad 121a and the flexible circuit 103, so as to assure that desired reliable contact of the bump contacts 115 with the contact pads 117 is maintained over prolonged periods of time. Like the bump contacts 115, only representative examples of the metallic springs 125a are shown in FIGS. 1 and 2A. The representative metallic springs 125a of FIGS. 1 and 2A are thus part of an array defined by such metallic springs 125a.

According to the preferred embodiment of the present invention, each bump contact 115 has a dedicated metallic spring 125a, and each metallic spring 125a is disposed generally in alignment with each bump contact 115. Thus, each spring 125a applies a compressive force to a dedicated pad with bump contacts 115, so as to assure desired reliable electrical contact between the bump contact 115 and its corresponding contact pad 117, and the springs 125a also are capable of moving with respect to one another so as to facilitate desired compliance.

As discussed above, such compliance is necessary so as to assure adequate electrical contact between the bump contacts 115 and the contact pads 117 when the contact pads 117 of the electronic device are not generally coplanar with one another. That is, by allowing the springs 125a to move in a direction orthogonal to the plane of the array of springs 125a (in the Z direction as shown in FIGS. 1 and 2A), substantial differences in the thicknesses and/or Z-axis positioning of the contact pads 117 can be accommodated.

With particular reference to FIG. 2A, according to one aspect of the present invention, the springs 125a extend upwardly from a shim stock base 123a and comprise a plurality, e.g., four, spokes 131 which radiate outwardly from a central hub 133 in a generally circular pattern (like the spokes of a wheel), such that when a spring 125a is compressed, the spokes 131 deform to provide a compressive force.

The elastomeric pad 121a is preferably disposed upon the opposite side of the array of springs 125a with respect to the flexible circuit 103. However, the elastomeric pad 121a may alternatively be disposed intermediate the array of springs 125a and the flexible circuit 103, if desired.

Figure 2B:
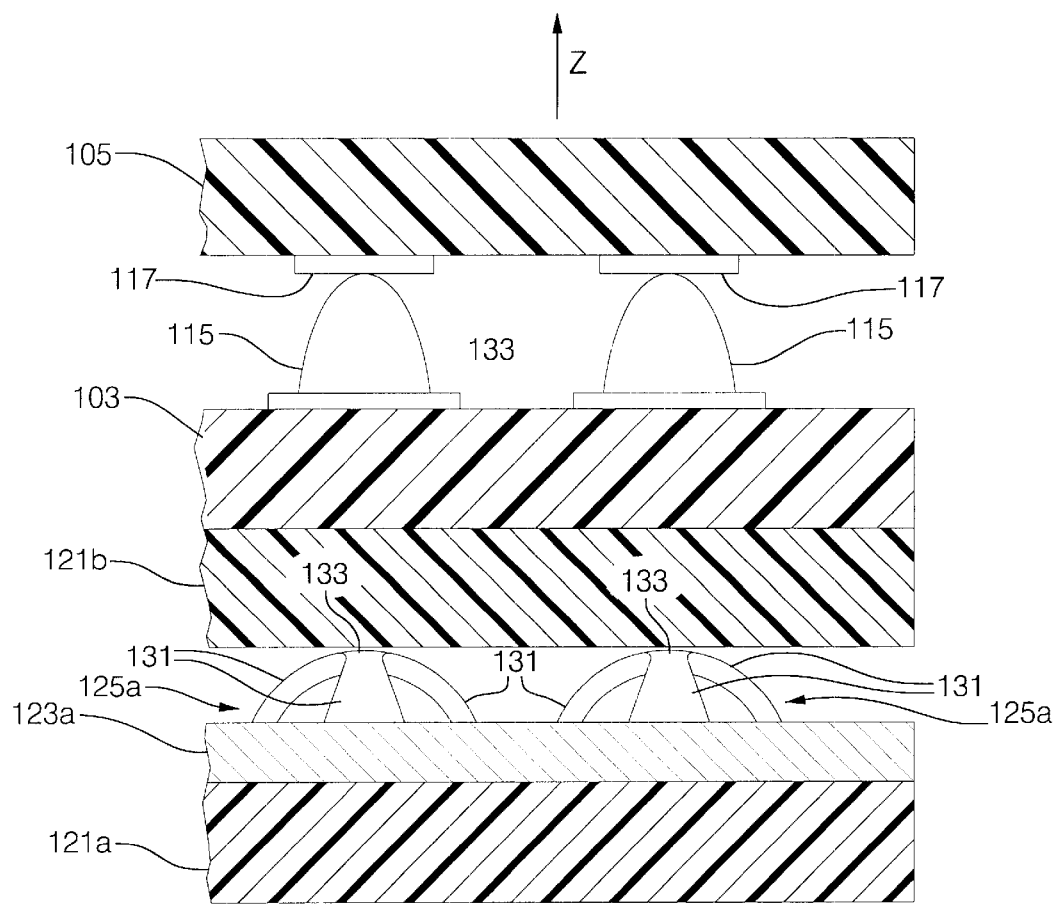
FIG. 2B is an enlarged semi-schematic fragmentary side view of an alternative configuration of the present invention, wherein resilient material is disposed upon both sides of the springs.

Referring now to FIG. 2B, as a further alternative two elastomeric pads, 121a and 121b, may be utilized, such that the array of springs 125a is sandwiched between the two elastomeric pads 121a and 121b. The elastomeric pads 121a and 121b may, for example, be formed of Silastic, Dow Corning part number 94-595-HC or Poron, Rogers Corp. of Chandler, Ariz. part number HT 840. Those skilled in the art will appreciate that various other elastomers are likewise suitable for use in the formation of the elastomeric pads 121a and 121b.

The discussion and illustration of the contacts of the flexible circuit 103 being formed as bump contacts 115 is by way of example only, and not by way of limitation. Those skilled in the art will appreciate that the contacts of the flexible circuit 103 must be compatible with the complementary contacts (such as the contact pads 117) of the electronic device 105 to which the flexible circuit 103 is to be electrically connected, but the contacts may be of various different configurations. Thus, for example, if bump contacts are provided on the electronic device 105, then the flexible circuit 103 may alternatively comprise contact pads. Indeed, the contacts of the flexible circuit 103 and/or the electronic device 105 need not all be of a single configuration. According to the present invention, various different configurations and combinations of configurations of the contacts of the flexible circuit 103, as well as of the electronic device 105, are contemplated.

Various different configurations of the springs 125a are likewise suitable. According to a further aspect of the present invention, another preferred configuration of the springs 125a is shown in FIGS. 3–5 and is discussed in detail below.

Figure 3:
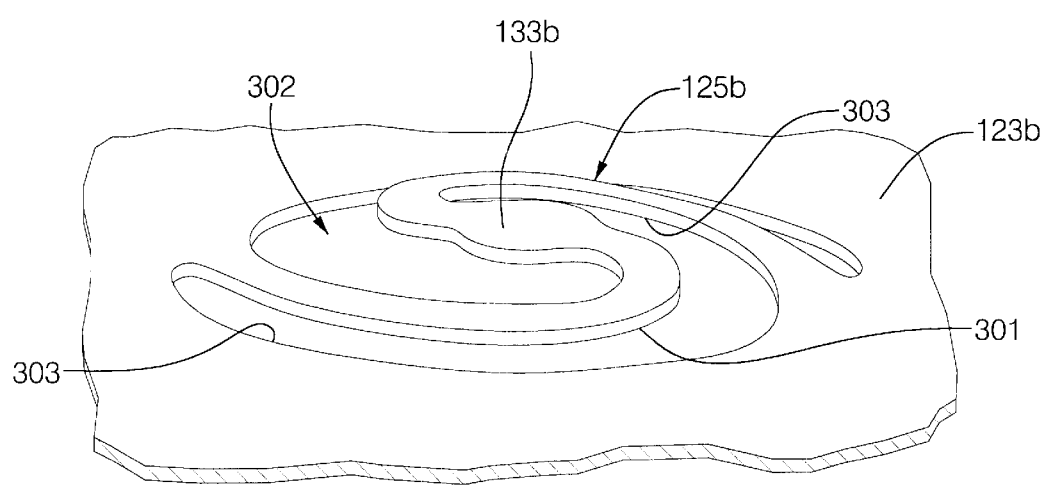
FIG. 3 is a semi-schematic fragmentary perspective view of another embodiment of a metallic spring according to the present invention.
Figure 4:
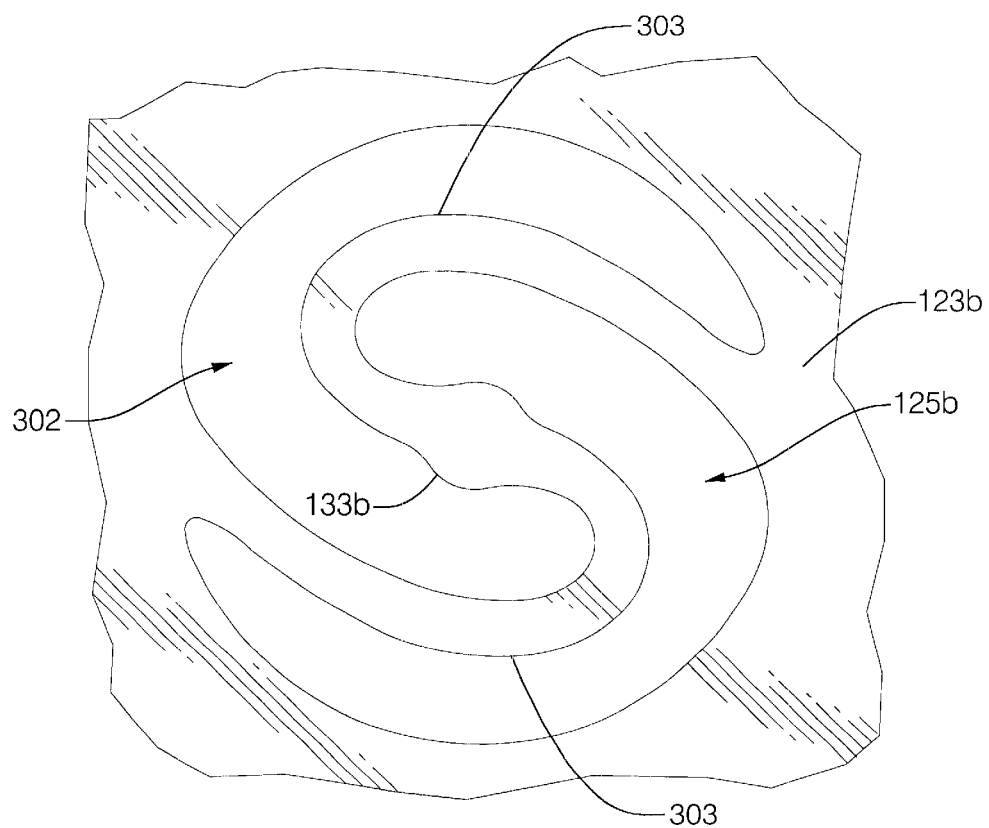
FIG. 4 is an enlarged semi-schematic fragmentary top view of the metallic spring of FIG. 3.
Figure 5:
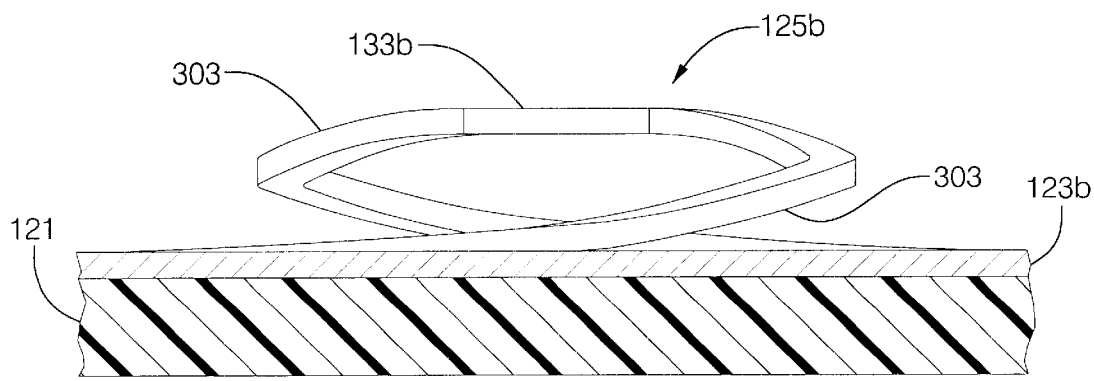
FIG. 5 is a semi-schematic fragmentary side view of the metallic spring of FIG. 3, also showing an elastomeric pad in laminar juxtaposition with respect to the base of the metallic spring.

Referring now to FIGS. 3–5, another configuration of the springs 125b comprises generally S-shaped structures disposed generally within openings 302 formed in the base 123b. Each spring 125b comprises a central hub 133b from which two legs 303 extend toward and connect with the base 123b.

According to the present invention, the springs 125a, 125b are preferably etched from a non-relieved sheet of metal, e.g., a metallic shim stock. The springs 125a, 125b may be formed by etching a metallic shim formed of non-relieved sheet steel. The springs 125a, 125b may also be formed by stamping or die cutting. Those skilled in the art will appreciate that various other methodologies for forming the springs 125a, 125b are likewise suitable. The sheet steel preferably has a thickness of between approximately 0.001 inch and approximately 0.003 inch, preferably approximately 0.002 inch. Those skilled in the art will appreciate that the springs 125a and 125b may be formed from sheet steel having various different desired thicknesses.

Referring again to FIG. 1, in use, the electronic device 105, such as a printed circuit board or an integrated circuit, is placed in reliable electrical communication with a flexible circuit 103 by clamping at least a portion of the electronic device 105 to at least a portion of the flexible circuit 103 using the clamping device 101. The elastomeric pad 121a (and/or the elastomeric pad 121b of FIG. 2B), along with an array of metallic springs 125a, which are preferably attached to the elastomeric pad(s) 121a and/or 121b, are clamped along with the electronic device 105 and the flexible circuit 103.

The array of metallic springs 125a is preferably attached to the laminary juxtaposed elastomeric pad 121a. Such attachment of the array of metallic springs 125a to the elastomeric pad 121a may be accomplished via adhesive bonding, thermal bonding (wherein the surface of the elastomeric pad 121a is at least partially melted so as to adhere to the array of metal springs 125a), via fasteners such as rivets or by any other suitable method. Alternatively, the array of metallic springs 125a may be separate from, i.e., not attached to, the elastomeric pads 121a and/or 121b.

The bump contacts 115 of the flexible circuit 103 are generally aligned with the contact pads 117 of the electronic device 105. Preferably, the springs 125a are similarly aligned with the bump contacts 115 of the flexible circuit 117. The clamping device 101 is configured to effect compression of the stack defined by the flexible circuit 103, electronic device 105, elastomeric pad 121a, and springs 125a. Such compression of the stack causes the bump contacts 115 to deform as they are urged toward the contact pads 117 and to thus provide reliable electrical contact between the flexible circuit 103 and the electronic device 105.

As shown in FIG. 1, such compression may be effected by tightening the bolts 111 with respect to their corresponding nuts 113, such that the first 107 and second 109 clamp members are moved toward one another. Those skilled in the art will appreciate that various other clamping structures are likewise suitable. For example, various clip, clamp and/or spring arrangements may similarly be utilized.

Because the springs 125a provide a compressive force to the bump contacts 115, wherein the compressive force is concentrated generally at that portion of the flexible circuit 103 where the bump contacts 115 are located, less compressive force is required than is the case when the metallic springs 125a are not utilized. Since less compressive force is required, the clamping device 101 does not need to be as structurally strong as when no metallic springs 125a are utilized. Therefore, the clamping device 101 may be comprised of a less expensive material, such as plastic, rather than metal. Not only is the cost of the clamping device 101 reduced, but also the weight thereof is similarly reduced. This reduction in weight of the clamping device 101 may be particularly significant in weight sensitive applications, such as satellites and space craft, particularly when a large number of such electronic interconnects 100 are utilized.

The use of the metallic springs 125a of the present invention provides continued compressive force to the bump contacts 115 and their corresponding contact pads 117 in the event that the elastomeric pad 121a takes a compression set and fails to provide compressive force. Indeed, the metallic springs 125a may be configured so as to provide all of the compressive force necessary to ensure adequate contact of the bump contacts 115 with the contact pads 117, such that the elastomeric pad 121a may be entirely omitted, if desired.

The elastomeric pad 121a provides compliance. That is, the elastomeric pad 121a can bend and move so as to allow the springs 125a to move in a manner which accommodates non-coplanar alignment of the contact pads 117.

It is understood that the exemplary electronic interconnect described herein and shown in the drawings represents only a presently preferred embodiment of the invention. Indeed, various modifications and additions may be made to such embodiment without departing from the spirit and scope of the invention. For example, various different configurations of the springs are contemplated. Thus, the springs need not necessarily be circular in configuration, but rather may be of any other desired shape, e.g., triangular, rectangular, square, hexagonal, octagonal, etc., which is desirable. It is understood that the springs 125a of FIGS. 1 and 2A are considered to be generally functionally equivalent to the springs 125b of FIGS. 3–5. Thus, either the springs 125a or the springs 125b may be utilized, as desired. Indeed, various different configurations of the springs are contemplated. For example, the springs may have any desired number of legs, e.g., one, two, three, four, five, six, seven, or eight. Further, the springs may be comprised of any desired material which has the necessary spring characteristics. Thus, these and other modifications and additions may be obvious to those skilled in the art and may be implemented to adapt the present invention for use in a variety of different applications.

What is claimed is:

1. An electronic interconnect comprising:
   a flexible circuit having a plurality of contacts formed thereon;
   an electronic component with a plurality of pads formed thereon;
   a plurality of springs positioned so as to apply a compressive force to at least one of the contacts when the electronic interconnect is mated with said electronic component; and
   a resilient material, said resilient material configured to apply a compressive force to at least one of the springs when said flexible circuit, said electronic component, and said plurality of springs are in a clamped position.

2. The electronic interconnect as recited in claim 1, wherein the resilient material comprises an elastomer disposed on an opposite side of the springs with respect to the flexible circuit.

3. The electronic interconnect as recited in claim 1, wherein the resilient material comprises an elastomer disposed on each of two opposite sides of the springs.

4. The electronic interconnect as recited in claim 1, wherein the springs comprise metallic springs.

5. The electronic interconnect as recited in claim 1, wherein the springs comprise an array of metallic springs.

6. The electronic interconnect as recited in claim 1, wherein:
   the contacts comprise a array of bump contacts; and
   the springs comprise a corresponding array of springs, each spring being configured to apply a compressive force to a dedicated pad having a plurality of bump contacts formed thereon when the electronic interconnect is mated.

7. The electronic interconnect as recited in claim 1, wherein the springs are disposed on an opposite side of the flexible circuit with respect to the contacts.

8. The electronic interconnect as recited in claim 1, wherein:

the contacts comprise a array of bump contacts;

the springs comprise a corresponding array of springs, each spring being configured to apply a compressive force to a dedicated pad having a plurality of bump contacts formed thereon when the electronic interconnect is mated; and the resilient material comprises a sheet of elastomer configured to apply a compressive force to the springs when the interconnect is mated.

9. The electronic interconnect as recited in claim 1, wherein:

the contacts comprise an array of bump contacts;

the springs comprise a corresponding array of springs, each spring being configured to apply a compressive force to a dedicated pad having at least one bump contact formed thereon; and the resilient material comprises a sheet of elastomer, said sheet configured to apply a compressive force to the springs yet allow for substantially independent movement of the springs with respect to one another.

10. The electronic interconnect as recited in claim 1, wherein:

the contacts comprise an array of bump contacts;

the springs comprise a corresponding array of springs, each spring being configured to apply a compressive force to a dedicated pad having at least one bump contact formed thereon; and the resilient material comprises a sheet of elastomer, said sheet configured to apply a compressive force to the springs yet allow for substantially independent movement of each spring in an orthogonal direction to a plane of the array of springs.

11. A method for electronically interconnecting a flexible circuit and an electronic device, the method comprising:

positioning a flexible circuit having a plurality of contacts formed thereon, such that the contacts of the flexible circuit are substantially aligned with corresponding contacts of the electronic device; and compressing a plurality of springs and a resilient material so as to apply a compressive force to the contacts of the flexible circuit and the corresponding contacts of the electronic device.

12. The method as recited in claim 11, wherein the resilient material comprises an elastomer disposed on an opposite side of the springs with respect to the flexible circuit.

13. The method as recited in claim 11, wherein the resilient material comprises an elastomer disposed on each of two opposite sides of the spring.

14. The method as recited in claim 11, wherein the springs comprise metallic springs.

15. The method as recited in claim 11, wherein the springs comprise an array of metallic springs.

16. The method as recited in claim 11, wherein the springs comprise an array of springs and the bump contacts comprise a corresponding array of bump contacts, and wherein each spring is configured so as to apply a compressive force to a dedicated one of the bump contacts when the electronic interconnect is mated.

17. The method as recited in claim 11, wherein the springs are disposed on an opposite side of the flexible circuit with respect to the contacts.

18. The method as recited in claim 11, wherein:

the contacts comprise a array of bump contacts;

the springs comprise a corresponding array of springs, each spring being configured to apply a compressive force to a dedicated one of the bump contacts when the electronic interconnect is mated; and the resilient material comprises a sheet of elastomer configured to apply a compressive force to the springs when the interconnect is mated.

19. The method as recited in claim 11, wherein:

the contacts comprise an array of bump contacts;

the springs comprise a corresponding array of springs, each spring being configured to apply a compressive force to a dedicated pad having at least one bump contact formed thereon; and the resilient material comprises a sheet of elastomer, said sheet configured to apply a compressive force to the springs yet allow for substantially independent movement of the springs with respect to one another.

20. The method as recited in claim 11, wherein:

the contacts comprise an array of bump contacts;

the springs comprise a corresponding array of springs, each spring being configured to apply a compressive force to a dedicated pad having at least one bump contact formed thereon; and the resilient material comprises a sheet of elastomer, said sheet configured to apply a compressive force to the springs yet allow for substantially independent movement of each spring in an orthogonal direction to a plane of the array of springs.

* * * * *